United States Patent [19]
Hall et al.

[11] 4,130,807
[45] Dec. 19, 1978

[54] FEEDFORWARD AMPLIFIERS

[75] Inventors: Ralph A. Hall, Sawbridgeworth; Peter E. Radley, Harlow, both of England

[73] Assignee: International Standard Electric Corporation, New York, N.Y.

[21] Appl. No.: 809,584

[22] Filed: Jun. 24, 1977

[30] Foreign Application Priority Data
Aug. 19, 1976 [GB] United Kingdom .............. 34582/76

[51] Int. Cl.$^2$ .......................... H03F 1/26; H03F 3/68
[52] U.S. Cl. ................................. 330/124 R; 330/149; 330/151
[58] Field of Search .................. 330/124 R, 149, 151; 328/163; 325/474, 475, 476

[56] References Cited

U.S. PATENT DOCUMENTS

| | | | |
|---|---|---|---|
| 3,430,156 | 2/1969 | Katzin | 330/124 R X |
| 3,541,467 | 11/1975 | Seidel | 330/149 X |
| 3,624,534 | 11/1971 | Clayworth | 330/149 X |
| 3,825,843 | 7/1974 | Felsberg et al. | 330/151 X |
| 3,886,470 | 5/1975 | O'Neil et al. | 330/151 X |

OTHER PUBLICATIONS

Seidel et al., "Error-Controlled High Power Linear Amplifiers as UHF," *The Bell System Technical Journal*, May–Jun. 1968, pp. 691–701.

*Primary Examiner*—James B. Mullins
*Attorney, Agent, or Firm*—John T. O'Halloran; Alfred C. Hill

[57] ABSTRACT

In a feedforward amplifier the balance of the error cancelling loop can be controlled in amplitude and phase by a variable resistor and a variable capacitor connected to the input to the auxiliary amplifier. This can (a) be used for remotely controlled amplifiers to maximize the effect of phase scatter of third order intermodulation vectors, or (b) in a terminal to introduce deliberate distortion to cancel distortion introduced in line amplifiers.

9 Claims, 1 Drawing Figure

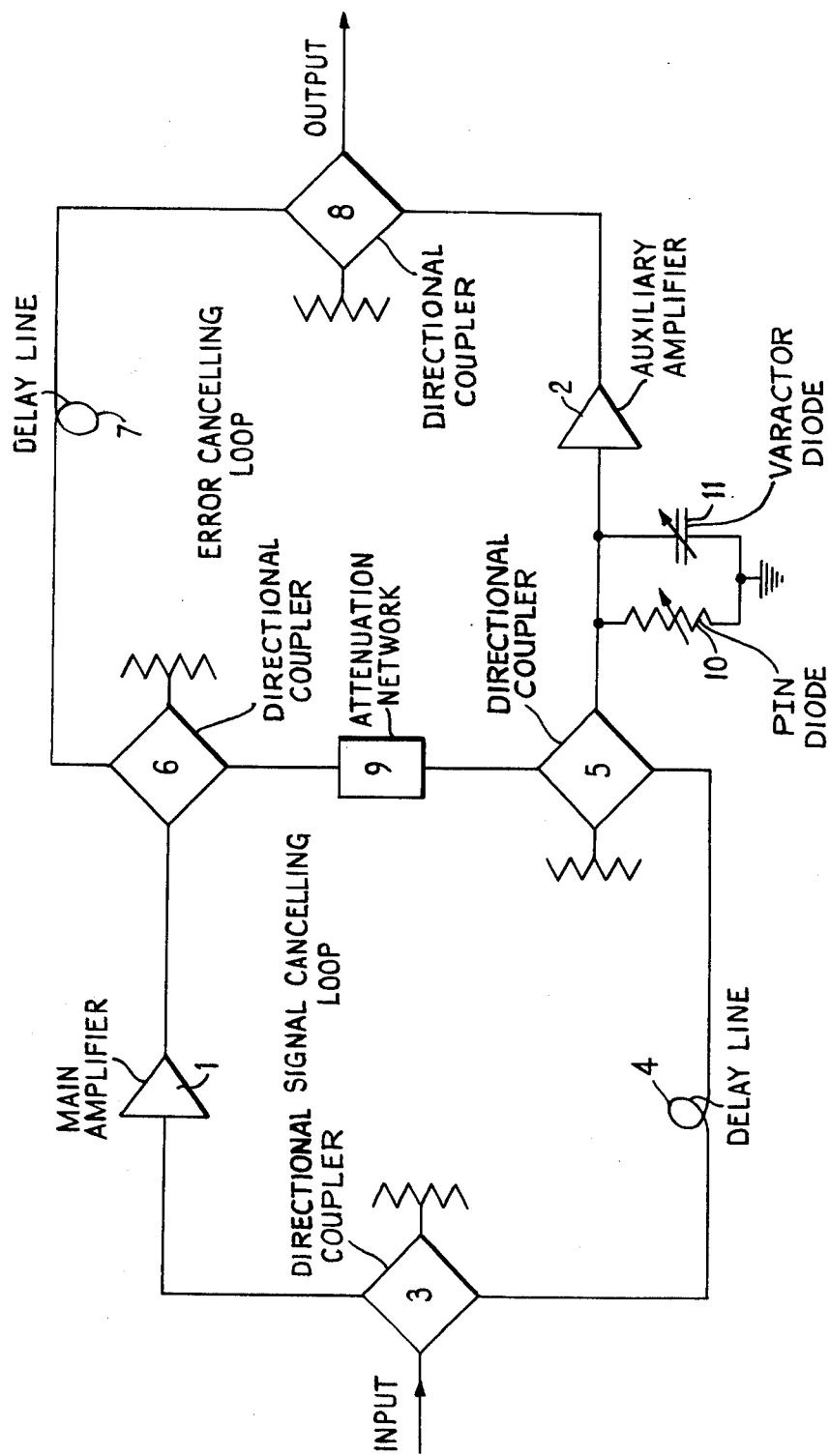

FEEDFORWARD AMPLIFIERS

BACKGROUND OF THE INVENTION

This invention relates to feedforward amplifiers such as may be used in coaxial line transmission systems.

Feedforward amplifiers may be generally defined as having main and auxiliary amplifier stages in separate amplifying channels connected in parallel between common input and output terminals, each amplifier stage having its own negative feedback path, with a cross connection between the output of the main amplifier stage and the input of the auxiliary amplifier stage. The various connection between the two channels and the terminals are conveniently made by way of directional couplers which provide isolation between the different parts of the circuits where required.

In long distance coaxial line transmission systems, e.g. in submarine systems, it is necessary to reduce the effects of 3rd order intermodulation vectors. One convenient method of doing this is to introduce phase scattering of the vectors along the system. Alternatively intermodulation products could be cancelled at the end of the system.

SUMMARY OF THE INVENTION

An object of the present invention is to provide an improved feedforward amplifier.

A feature of the present invention is the provision of a feedforward amplifier comprising: a main amplifier stage disposed in a signal cancelling loop coupled to an input of the feedforward amplifier; an auxiliary amplifier stage disposed in an error cancelling loop coupled between the signal loop and an output of the feedforward amplifier; and control means coupled to said error loop for controlling signals coupled to said output.

Typically the means for controlling the amplitude and phase of the signals fed to the output directional coupler comprises a variable resistor and a variable capacitor connected between the auxiliary amplifier input and ground. In a remote amplifier these devices can be respectively a PIN diode and a varactor diode the values of which can be remotely controlled by, for example, small changes in the d.c. (direct current) supply current.

BRIEF DESCRIPTION OF THE DRAWING

The above-mentioned and other features and objects of the present invention and the manner of obtaining them will become more apparent by reference to the following description taken in conjunction with the drawing, the single FIGURE of which is a block circuit diagram of a feedforward amplifier in accordance with the principles of the present invention.

DESCRIPTION OF THE PREFERRED EMBODIMENT

The basic feedforward amplifier has a main amplifier stage 1 and an auxiliary amplifier stage 2. The input signal is fed via an input directional coupler 3 to the main amplifier stage 1 and also via a delay line 4 and a second directional coupler 5 to the auxiliary amplifier stage 2. The output of the main amplifier stage 1 is fed via directional coupler 6, delay line 7 and output directional coupler 8 to the output, and via coupler 6, attenuation network 9 and coupler 5 to the auxiliary amplifier stage 2. The two delay lines delay the signals by amounts of time roughly equal to the transit times through each of the two amplifying stages so that the delays of paths 3-6-9-5 and 3-4-5 are equal but with a phase difference of 180° and similarly for paths 6-7-8 and 6-9-5-2-8. Each of the amplifying stages 1 and 2 is a conventional feedback amplifier in its own right. In operation, a comparison is made between the amplified signal from the main amplifier stage 1 and the delayed "reference" signal via delay line 4, and the "error" signal so formed is the input to the auxiliary amplifier stage 2. The error signal is then amplified in the auxiliary amplifier stage 2 to a suitable level for interference with the main amplifier stage 1 output, suitably delayed, in the output directional coupler 8.

To provide additional control of the amplitude and phase of the error signal a variable resistor 10 and a variable capacitor 11 are connected across the input to the auxiliary amplifier stage 2. In the case of an intermediate repeater in a long haul system, e.g. a submarine coaxial line transmission system, remote control of the amplitude and/or phase of the error signal can be achieved if the variable resistor and variable capacitor are a PIN diode and a varactor diode, respectively. The performance of the system can then be improved by remotely controlling the feedforward amplifiers to maximize the effect of phase scatter of 3rd order intermodulation vectors. This remote control can be either by small changes in the d.c. supply current to the repeaters or by the use of pilot signals.

Another application of the invention is where a set of terminal amplifiers are controlled such that the error cancelling loops are deliberately unbalanced so as to cause distortion products to cancel or reduce those caused in the line amplifiers.

While reference has been made to the controlling of amplitude and phase of the error signals, it will be appreciated that it may be necessary to control only one of these parameters, thus requiring only the variable resistor or the variable capacitor alone.

While we have described above the principles of our invention in connection with specific apparatus it is to be clearly understood that this description is made only by way of example and not as a limitation to the scope of our invention as set forth in the objects thereof and in the accompanying claims.

We claim:
1. A feedforward amplifier comprising:
   a main amplifier disposed in a signal canceling loop coupled to an input of said feedforward amplifier;
   an auxiliary amplifier disposed in an error cancelling loop coupled between said signal loop and an output of said feedforward amplifier; and
   control means directly connected between said error loop and ground for controlling both the amplitude and phase of signals coupled to said output.
2. An amplifier according to claim 1, wherein said control means is coupled to an input of said auxiliary amplifier stage to control the amplitude and phase of error signals coupled to said auxiliary amplifier stage.
3. An amplifier according to claim 2, wherein said control means includes
   a variable resistor to control the amplitude of said error signals.
4. An amplifier according to claim 3, wherein said variable resistor is a PIN diode.
5. An amplifier according to claim 3, wherein said control means includes a variable capacitor to control the phase of said error signals.

6. An amplifier according to claim 5, wherein said variable capacitor is a varactor diode.

7. An amplifier according to claim 2, wherein said control means includes
a variable capacitor to control the phase of said error signal.

8. An amplifier according to claim 7, wherein said variable capacitor is a varactor diode.

9. A feedfoward amplifier comprising:
a signal input;
a first directional coupler directly connected to said input;
a main amplifier directly connected to said first coupler;
a first delay line directly connected to said first coupler;
a second directional coupler directly connected to said main amplifier;
a third directional coupler directly connected to said first delay line;
attenuation network directly connected between said second and third couplers;
a second delay line directly connected to said second coupler;
an auxiliary amplifier directly connected to said third coupler;
a fourth directional coupler directly connected to said auxiliary amplifier, said second delay line and an output of said feedforward amplifier; and
a control means having one terminal directly connected to an input of said auxiliary amplifier and the other terminal directly connected to ground to control both the amplitude and phase of signals coupled to said output.

* * * * *